United States Patent
Hikita et al.

(10) Patent No.: US 7,132,703 B2
(45) Date of Patent: Nov. 7, 2006

(54) FIELD-EFFECT TRANSISTOR

(75) Inventors: Masahiro Hikita, Ashiya (JP); Manabu Yanagihara, Toyonaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 60 days.

(21) Appl. No.: 11/014,893

(22) Filed: Dec. 20, 2004

(65) Prior Publication Data

US 2005/0139870 A1  Jun. 30, 2005

(30) Foreign Application Priority Data

Dec. 26, 2003  (JP)  ............... 2003-433905

(51) Int. Cl.
*H01L 29/80*  (2006.01)
(52) U.S. Cl. .............. 257/280; 287/281; 438/570
(58) Field of Classification Search ................ 257/280, 257/281, 282, 283, 284, 192, 191, 29; 438/570
See application file for complete search history.

(56) References Cited

U.S. PATENT DOCUMENTS 6,064,082 A * 5/2000 Kawai et al. ............... 257/192
2003/0218183 A1* 11/2003 Micovic et al. ............ 257/192

OTHER PUBLICATIONS

Nienhaus, H. et al., "Ionization Energy and Electron Affinity of Clean and Oxidized AlxGa1-xN (0001) Surfaces", Mat. Res. Soc. Symp. Proc. 680 (2001) E4.5, p. 1; http://fkpme246a.uni-duisburg.de/ag_lorke/publications/nienhaus/article-Nienhaus-id134.pdf.*

* cited by examiner

*Primary Examiner*—Nathan J. Flynn
(74) *Attorney, Agent, or Firm*—McDermott Will & Emery LLP

(57) ABSTRACT

A field-effect transistor includes: a carrier supply layer supplying carriers; a Schottky contact layer forming a Schottky barrier; and an intermediate layer formed between the carrier supply layer and the Schottky contact layer. Here, the intermediate layer has an electron affinity which is higher than an electron affinity of the carrier supply layer but lower than an electron affinity of the Schottky contact layer.

5 Claims, 10 Drawing Sheets

FIG.7

| | COMPOSITION | THICKNESS (nm) | RATIO x OF Al | RATIO y OF In | CARRIER CONCENTRATION (cm⁻³) |
|---|---|---|---|---|---|
| OHMIC CONTACT LAYER | In y Ga 1-y As | 50 | 0 | 0.5 | 4.E+19 |
| LOW RESISTANCE LAYER | n-Ga As | 100 | 0 | 0 | 3.E+18 |
| SCHOTTKY CONTACT LAYER | In y Ga 1-y P | 5 | 0 | 0.48 | UNDOPED |
| INTERMEDIATE LAYER | Al x Ga 1-x As | 10 | 0.25~0 | 0 | UNDOPED |
| CARRIER SUPPLY LAYER | Al x Ga 1-x As | 10 | 0.25 | 0 | 3.E+18 |
| CHANNEL LAYER | In y Ga 1-y As | 15 | 0 | 0.2 | UNDOPED |
| BARRIER LAYER | Al x Ga 1-x As | 10 | 0.25 | 0 | 3.E+18 |
| BUFFER LAYER | Ga As | 500 | 0 | 0 | UNDOPED |

FIG.8

| METHOD OF CRYSTAL GROWTH | METALORGANIC CHEMICAL VAPOR EPITAXY (MOVPE METHOD) |
|---|---|
| MATERIAL GAS INCLUDING GROUP III ELEMENT | TRIMETHYL GALLIUM (TMGa) TRIMETHYL ALUMINUM (TMAl) TRIMETHYL INDIUM (TMIn) |
| MATERIAL GAS INCLUDING GROUP V ELEMENT | ARSINE (AsH$_3$) |
| DOPANT GAS | SILANE (SiH$_4$) |
| PRESSURE | ONE ATMOSPHERE (ATMOSPHERIC PRESSURE) |
| CARRIER GAS | HYDROGEN |

FIG.9

| | MATERIAL | | | TEMPERATURE OF SUBSTRATE(°C) |
|---|---|---|---|---|
| | GROUP III | GROUP V | DOPANT | |
| OHMIC CONTACT LAYER | TMGa, TMAl | ARSINE | SILANE | 520 |
| LOW RESISTANCE LAYER | TMGa | ARSINE | SILANE | 550 |
| SCHOTTKY CONTACT LAYER | TMGa, TMIn | PHOSPHINE | NOT USED | 600 |
| INTERMEDIATE LAYER | TMGa, TMAl | ARSINE | NOT USED | 550 |
| CARRIER SUPPLY LAYER | TMGa, TMAl | ARSINE | SILANE | 550 |
| CHANNEL LAYER | TMGa, TMAl | ARSINE | NOT USED | 550 |
| BARRIER LAYER | TMGa, TMAl | ARSINE | SILANE | 550 |
| BUFFER LAYER | TMGa | ARSINE | NOT USED | 550 |

FIG.10

| | SUBSTRATE | CARRIER SUPPLY LAYER | INTERMEDIATE LAYER | SCHOTTKY CONTACT LAYER |
|---|---|---|---|---|
| EXAMPLE 1 | GaAs | GaAlInP | GaAlInP (RATIO OF Al CHANGES) | GaInP |
| EXAMPLE 2 | InP | InAlAs | InAlAs (RATIO OF Al CHANGES) | InP |

FIELD-EFFECT TRANSISTOR

BACKGROUND OF THE INVENTION (1) Field of the Invention

The present invention relates to a field-effect transistor (FET), especially to an FET for use in a high-frequency communication device.

(2) Related Art

Conventionally, a Metal-Insulator-Semiconductor Field-Effect Transistor (MISFET), which is an insulated-gate FET, has been utilized in an electronic device such as a silicon semiconductor integrated circuit device.

When compared with a silicon (Si) Metal-Oxide-Semiconductor Field-Effect Transistor (MOSFET) of the same size, an FET formed using gallium arsenide (GaAs) or a combination of GaAs and aluminum gallium arsenide ($Al_xGa_{1-x}As$) provides higher-speed performance, and is more suitable for a microwave amplifier and a high-speed logic IC. This is because group III–V compound semiconductors such as GaAs, InP and GaN have a higher (approximately five- to six-fold) electron mobility than Si. An FET formed using a semiconductor with such a high electron mobility achieves excellent high-frequency characteristics.

However, a MOSFET or MISFET formed using a group III–V compound semiconductor such as GaAs has a problem regarding interface states. To be specific, interface states are formed at an interface between an insulating film and a compound semiconductor. Because such interface states lower mutual conductance (gm), the MOSFET or MISFET can not achieve good performance.

For this reason, a Metal Semiconductor Field-Effect Transistor (MESFET) or a High Electron Mobility Transistor (HEMT) formed using a compound semiconductor such as GaAs is used for a constituent of an electronic device such as a high-frequency amplifier and an ultrahigh-speed integrated circuit device. For example, a MESFET is used as an amplifying element in a mobile communication device such as a mobile telephone, and a HEMT is used as an amplifying element in a receiving antenna for satellite broadcasting.

In particular, a HEMT provides high-speed performance and low noise figure, since two-dimensional electron gas (2DEG) which is produced in a channel layer made of high-purity InGaAs and has a high electron mobility is used as carriers. To be specific, a layer in which electrons are generated (carrier supply layer) and a layer in which electrons move (the channel layer) are separated from each other. Therefore, electrons can move stably at high speed from a source to a drain without colliding with impurities, thereby reducing noise figure.

Here, to increase a surface charge density of the 2DEG accumulated in the channel layer, an energy barrier formed at an interface between the channel layer and the carrier supply layer needs to be made as high as possible.

In the HEMT, a Schottky contact layer and an ohmic contact layer are formed, in the stated order, on the carrier supply layer during a wafer epitaxial growth. The ohmic contact layer is partially removed, so as to partially expose the Schottky contact layer. A gate electrode is provided on the exposed surface of the Schottky contact layer. Furthermore, a source electrode and a drain electrode are formed on the ohmic contact layer so as to oppose each other with the gate electrode therebetween.

As described above, the Schottky contact layer, on which the gate electrode is formed, is sandwiched between the carrier supply layer and the ohmic contact layer. Here, a high Schottky barrier is formed between the gate electrode and the Schottky contact layer. A height $\Phi_B$ of the Schottky barrier is defined as a difference between an electron affinity $\phi_s$ of the Schottky contact layer and an electron affinity $\phi_m$ of a metal forming the gate electrode, as indicated by the following formula (1):

$$\Phi_B = \phi_m - \phi_s \quad (1)$$

If the Schottky barrier $\Phi_B$ is sufficiently high, electrons in the carrier supply layer and the 2DEG accumulated in the channel layer are difficult to overcome or pass through the Schottky barrier $\Phi_B$ to flow into the gate electrode. This can reduce leakage currents caused when a reverse bias is applied, and improve resistance to dielectric breakdown.

The Schottky contact layer forms a path of electric currents flowing between the source electrode and the drain electrode. In detail, electrons need to go through the Schottky contact layer in order to reach the channel layer from the source electrode, and in order to reach the drain electrode through the channel layer. Therefore, while forming a high Schottky barrier (high resistance) with respect to the gate electrode as stated above, the Schottky contact layer is required to provide a lowest possible resistance with respect to the source electrode and the drain electrode. To meet these contradictory needs, the ohmic contact layer is formed between the Schottky contact layer and the source and drain electrodes. As a result, an ohmic contact, which has a low resistance, is formed between each of the source and drain electrodes and the ohmic contact layer. Hence, a resistance between the source and drain electrodes is reduced.

Furthermore, the Schottky contact layer is conventionally made of the same material as the carrier supply layer, which is AlGaAs. Therefore, the Schottky barrier $\Phi B$ is relatively high in the HEMT including the Schottky contact layer made of AlGaAs. This results in reduction in leakage currents caused when the gate electrode is reverse-biased.

However, the HEMT including the Schottky contact layer made of AlGaAs has a problem of frequency dispersion of drain currents. In other words, a maximum drain current density decreases when a high-frequency signal is applied. Frequency dispersion of drain conductance causes a degree of amplification of a circuit to vary in accordance with an operating frequency. This makes it impossible to amplify a pulse appropriately.

A possible reason for such frequency dispersion of drain currents is that AlGaAs has a high interface state density. AlGaAs forms many interface states, that is to say, electron trap levels, at an interface between different layers. Electrons are trapped by the electron trap levels at the interface. Each of the electron trap levels releases trapped electrons into a conduction band after a lifetime of the electron trap level. Here, the lifetime of the interface states formed by AlGaAs is relatively long. If an FET with such many electron trap levels having a long lifetime operates at a frequency corresponding to the lifetime, the electron trap levels significantly affects frequency performance of the FET.

For example, some electron trap levels of a GaAs substrate have a long lifetime of several milliseconds. If an operating frequency of several KHz is set as a criteria, there is a large difference in performance of the FET between when operating at frequencies lower and higher than the criteria. This causes frequency dispersion of drain conductance.

The problem of the frequency dispersion can be solved by a technique disclosed in Japanese patent application H15-032038. This technique uses InGaP for a Schottky contact layer, instead of AlGaAs.

FIG. 5 illustrates a cross-section of an FET 50 disclosed in the patent document. As shown in FIG. 5, the FET 50 is formed by providing an AlGaAs buffer layer 61, an n-AlGaAs barrier layer 62, an undoped InGaAs channel layer 63, an n-AlGaAs carrier supply layer 64, an undoped InGaP Schottky contact layer 65, and an ohmic contact layer 66 which has an opening so that part of the Schottky contact layer 65 is exposed, in the stated order, on a GaAs semiconductor substrate 60.

Furthermore, a gate electrode 67 is formed so as to be in contact with the Schottky contact layer 65, and a source electrode 68 and a drain electrode 69 are each formed so as to be in contact with the ohmic contact layer 66.

The Schottky contact layer 65 is made of InGaP, which has a lower interface state density than AlGaAs. Therefore, the number of interface states formed at an interface between the Schottky contact layer 65 and the gate electrode 67 can be reduced. This can reduce frequency dispersion of drain currents.

However, the conventional FET 50 has the following drawback. A discontinuity in energy of a conduction band (hereinafter referred to as a band discontinuity) occurs at an interface between the AlGaAs carrier supply layer 64 and the InGaP Schottky contact layer 65. This band discontinuity blocks electrons passing through the interface between the carrier supply layer 64 and the Schottky contact layer 65. Therefore, a source resistance Rs of the FET 50 increases, and mutual conductance (gm), which is one of the properties of the FET 50, accordingly decreases. As a result, the FET 50 can not obtain a sufficient current drive power.

It is known that the amount of a band discontinuity at an interface between different layers is generally determined by materials of the layers, and that, if the layers are each made of mixed crystal, a composition of each of the layers determines the amount of the band discontinuity. Here, the mutual conductance (gm) is calculated by the following formula (2):

$$gm = gmi/(1 + Rs \times gmi) \quad (2)$$

In the formula (2), gm, gmi, and Rs respectively denote mutual conductance, intrinsic mutual conductance, and a source resistance. If the carrier supply layer 64 is made of $Al_{0.25}Ga_{0.75}As$, as an example, a band discontinuity of approximately 0.3 eV occurs at the interface between the AlGaAs carrier supply layer 64 and the InGaP Schottky contact layer 65, as shown in FIG. 6.

In FIG. 6, an energy level of a conduction band is plotted on the vertical axis, and the layers composing the FET 50 are plotted on the horizontal axis in the order of the lamination on the substrate 60.

SUMMARY OF THE INVENTION

In view of the above problem, an object of the present invention is to provide an FET that has a lower source resistance Rs than in the related art.

The above object can be achieved by a field-effect transistor including: a carrier supply layer supplying carriers; a Schottky contact layer forming a Schottky barrier; and an intermediate layer formed between the carrier supply layer and the Schottky contact layer. Here, the intermediate layer has an electron affinity which is higher than an electron affinity of the carrier supply layer but lower than an electron affinity of the Schottky contact layer.

According to this construction, a source resistance of the FET can be reduced for the following reason. If the intermediate layer is configured to have a constant electron affinity, a band discontinuity (ΔEc) at an interface between the intermediate layer and the Schottky contact layer and a band discontinuity (ΔEc) at an interface between the intermediate layer and the carrier supply layer are each smaller than a band discontinuity to be generated at the interface between the Schottky contact layer and the carrier supply layer when the intermediate layer is not provided. As a result, electrons can move smoothly through the Schottky contact layer and the carrier supply layer, to a channel layer adjacent to the carrier supply layer.

Here, an electron affinity indicates an energy required to excite electrons from a bottom of a conduction band to a vacuum level.

An electron affinity (χ) is calculated by the following formula (3), where EVAC denotes a vacuum level, and Ec denotes an energy of a conduction band:

$$\chi = EVAC - Ec \quad (3)$$

According to the formula (3), when an electron affinity decreases, an energy (Ec) of a conduction band increases. On the other hand, when an electron affinity increases, an energy (Ec) of a conduction band decreases. Since a vacuum level for each layer is the same, a difference in electron affinity is equal to the amount of a band discontinuity (ΔEc).

Here, the field-effect transistor may further include: a low resistance layer formed on the Schottky contact layer, where the low resistance layer has an electron affinity which is different, by less than 0.1 eV, from the electron affinity of the Schottky contact layer; an ohmic contact layer formed on the low resistance layer; and an electrode formed on the ohmic contact layer.

According to this construction, the amount of a band discontinuity at an interface between the Schottky contact layer and the low resistance layer is less than 0.1 eV. Here, the band discontinuity of less than 0.1 eV is so small that an energy barrier does not exist virtually at the interface. Therefore, electrons can go through the interface from or to the low resistance layer smoothly. This can improve performance of the FET.

Here, the electron affinity of the intermediate layer may gradually increase from an interface between the intermediate layer and the carrier supply layer to an interface between the intermediate layer and the Schottky contact layer.

According to this construction, the electron affinity continuously and gradually increases in the intermediate layer to prevent a band discontinuity. Therefore, an energy barrier is not formed against electrons going through the intermediate layer. This can dramatically reduce the source resistance.

Here, a difference in electron affinity at the interface between the intermediate layer and the Schottky contact layer may be less than 0.1 eV.

According to this construction, the intermediate layer and the Schottky contact layer have approximately the same electron affinity at the interface therebetween. In other words, the amount of the band discontinuity can be less than 0.1 eV, which is so low that an energy barrier does not exist virtually. This can significantly lower a source resistance at the interface between the intermediate layer and the Schottky contact layer for electrons moving from or to the intermediate layer.

Here, the Schottky contact layer may be made of InGaP, the carrier supply layer may be made of $Al_{0.25}Ga_{0.75}As$, and the intermediate layer may be made of $Al_xGa_{1-x}As$, where $0 \leq x \leq 0.25$, x denoting a composition ratio. Furthermore, the composition ratio x may gradually increase from the interface between the intermediate layer and the Schottky contact layer to the interface between the intermediate layer and the carrier supply layer.

According to this construction, the Schottky contact layer is made of InGaP, and the carrier supply layer is made of AlGaAs. Furthermore, the electron affinity gradually increases in the intermediate layer from the interface between the intermediate layer and the carrier supply layer to the interface between the intermediate layer and the Schottky contact layer. This can disperse a band discontinuity between the carrier supply layer and the Schottky contact layer. Therefore, an increase in source resistance caused by the band discontinuity between the Schottky contact layer and the carrier supply layer can be effectively prevented. As a result, even if InGaP, which has a lower interface state density than AlGaAs, is used to form the Schottky contact layer in order to reduce frequency dispersion, a source resistance does not increase.

Here, the composition ratio x may gradually increase from 0 at the interface between the intermediate layer and the Schottky contact layer, to 0.25 at the interface between the intermediate layer and the carrier supply layer.

According to this construction, there is virtually no barrier between the intermediate layer and the carrier supply layer. This means no band discontinuity at the interface between the intermediate layer and the carrier supply layer, and a band discontinuity of only a small amount at the interface between the intermediate layer and the Schottky contact layer. Consequently, the source resistance of the FET can be dramatically lowered.

Here, the Schottky contact layer may be made of InGaP, the carrier supply layer may be made of $Al_{0.25}Ga_{0.75}As$, and the intermediate layer may be made of $Al_xGa_{1-x}As$, where x is a composition ratio and takes any value in a range no less than 0 but less than 0.25.

According to this construction, the Schottky contact layer is made of a different compound semiconductor from the carrier supply layer. In detail, the Schottky contact layer is made of InGaP, which has a lower interface state density than AlGaAs, to reduce frequency dispersion. The carrier supply layer is made of AlGaAs. In addition, the intermediate layer is formed between the AlGaAs carrier supply layer and the InGaP Schottky contact layer. The intermediate layer is made of $Al_xGa_{1-x}As$, where $0 \leq x < 0.25$, and an electron affinity of the intermediate layer is smaller than that of the Schottky contact layer and larger than that of the carrier supply layer. In this way, frequency dispersion of drain currents can be effectively reduced without increasing the source resistance. This is because the band discontinuity at each of the interface between the intermediate layer and the Schottky contact layer, and the interface between the intermediate layer and the carrier supply layer is made smaller than a band discontinuity between the Schottky contact layer and the carrier supply layer when the intermediate layer is not formed.

Furthermore, this intermediate layer in which the composition ratio x is constant can be manufactured in a simpler method than the intermediate layer in which the composition ratio x is continuously increased.

Here, the object can be also achieved by an field-effect transistor including: a carrier supply layer supplying carriers; and a Schottky contact layer provided on the carrier supply layer, the Schottky contact layer forming a Schottky barrier. Here, the carrier supply layer is divided into a first portion and a second portion, where the first portion is closer to the Schottky contact layer than the second portion is, and a composition of a compound semiconductor is different between the first portion and the second portion, so that a difference in electron affinity is smaller between the first portion and the Schottky contact layer, than between the second portion and the Schottky contact layer.

According to this construction, a difference in electron affinity is smaller between the first portion and the Schottky contact layer than between the second portion and the Schottky contact layer. Therefore, the amount of the band discontinuity at the interface between the carrier supply layer and the Schottky contact layer can be reduced, thereby effectively lowering the source resistance of the FET.

Here, the second portion may be made of $Al_{0.25}Ga_{0.75}As$, the first portion may be made of $Al_xGa_{1-x}As$, where x denotes a composition ratio. The composition ratio x may gradually increase from 0 at an interface between the first portion and the Schottky contact layer, to 0.25 at an interface between the first portion and the second portion.

According to this construction, an electron affinity gradually increases in the first portion from an interface between the first portion and the second portion to the interface between the first portion and the Schottky contact layer. Thus, an energy of a conduction band gradually decreases in the first portion. This effectively prevents the band discontinuity at the interface between the carrier supply layer and the Schottky contact layer, and therefore significantly lowers the source resistance of the FET.

BRIEF DESCRIPTION OF THE DRAWINGS

These and other objects, advantages and features of the invention will become apparent from the following description thereof taken in conjunction with the accompanying drawings which illustrate a specific embodiment of the invention.

In the drawings:

FIG. 7 shows favorable material, thickness, composition ratio, and carrier concentration for each layer of the FET 1 relating to the first embodiment;

FIG. 8 shows conditions for forming the semiconductor lamination 31 by crystal growth;

FIG. 9 shows conditions for forming each layer of the semiconductor lamination 31 by crystal growth; and FIG. 10 shows modification examples for a substrate, a carrier supply layer, and an intermediate layer, and a Schottky contact layer to realize the energy change pattern shown in FIG. 2 or 4.

DESCRIPTION OF THE PREFERRED EMBODIMENTS

The following describes embodiments of the present invention with reference to the attached figures.

(First Embodiment)

Construction

Figure 1:
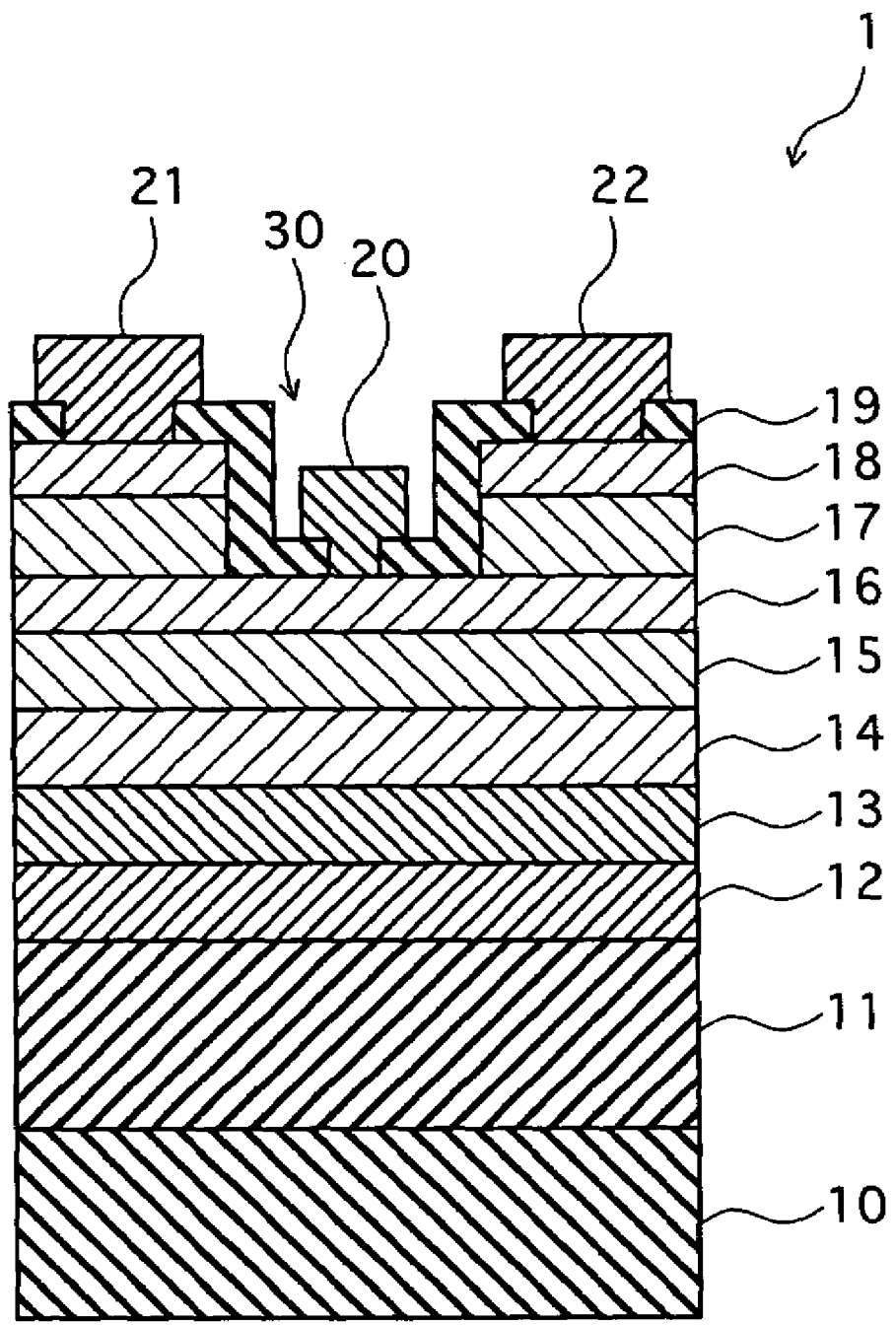
FIG. 1 is a cross-sectional view illustrating an FET 1 relating to a first embodiment.

FIG. 1 is a cross-sectional view illustrating an FET 1 relating to a first embodiment. As shown in FIG. 1, the FET 1 is formed in such a manner that a buffer layer 11, a barrier layer 12, a channel layer 13, a carrier supply layer 14, an intermediate layer 15, a Schottky contact layer 16, a low resistance layer 17, and an ohmic contact layer 18 are formed in this order on a GaAs compound semiconductor substrate 10. In addition, a source electrode 21 and a drain electrode 22 are formed on the ohmic contact layer 18, and a gate electrode 20 is formed on the Schottky contact layer 16.

The ohmic contact layer 18 and the low resistance layer 17 are partially removed so that part of the Schottky contact layer 16 is exposed, except for areas in which the source electrode 21 and the drain electrode 22 are formed. Thus, an opening 30 is formed in the ohmic contact layer 18 and the low resistance layer 17. The gate electrode 20 is formed in the opening 30 so as to be in contact with the Schottky contact layer 16.

Here, a silicon nitride film 19 is applied on a wall and a bottom of the opening 30 and a surface of the ohmic contact layer 18.

The buffer layer 11 is provided to improve a crystal structure of upper layers (especially the channel layer 13). The barrier layer 12 supplies carriers with the channel layer 13, and prevents leakage of carriers to the buffer layer 11.

The channel layer 13 is a region in which carriers move. The carrier supply layer 14 generates carriers. The Schottky contact layer 16 forms a high Schottky barrier to reduce leakage currents caused when the gate electrode 20 is reverse-biased.

The low resistance layer 17 and the ohmic contact layer 18 are provided to form an ohmic contact between the Schottky contact layer 16 and each of the source electrode 21 and the drain electrode 22. The low resistance layer 17 is provided to lower a resistance between the source electrode 21 and the drain electrode 22.

The intermediate layer 15 is an undoped layer originally to control a threshold voltage, which, when applied to a gate electrode, causes electric currents to start flowing between a drain electrode and a source electrode. According to the first embodiment, however, a composition ratio of the intermediate layer 15 is continuously changed, to reduce the amount of a band discontinuity between the carrier supply layer 14 and the Schottky contact layer 16, and therefore lowers a source resistance Rs.

FIG. 7 shows favorable material, thickness, composition ratio, and carrier concentration of each of the layers 11 to 18.

In FIG. 7, a value of 3. E+18 shown in a section of CARRIER CONCENTRATION, for example, indicates a carrier concentration of $3.0 \times 10^{18}$ cm$^{-3}$.

As seen from FIG. 7, the channel layer 13 is made of indium gallium arsenide, the carrier supply layer 14 and the intermediate layer 15 are each made of aluminum gallium arsenide, and the Schottky contact layer is made of indium gallium phosphide.

The carrier supply layer 14 and the intermediate layer 15 are both made of AlGaAs, but different from each other in terms of a ratio between Al and Ga. In detail, the carrier supply layer 14 is made of $Al_{0.25}Ga_{0.75}As$, and the intermediate layer 15 is made of $Al_xGa_{1-x}As$, where a composition ratio x changes from 0 (GaAs) to 0.25 ($Al_{0.25}Ga_{0.75}As$) in the intermediate layer 15.

Here, the composition ratio x is set to 0 at the interface between the intermediate layer 15 and the Schottky contact layer 16, and to 0.25 at the interface between the intermediate layer 15 and the carrier supply layer 14. Furthermore, the composition ratio x increases from 0 to 0.25 gradually, continuously, and linearly. To sum up, a portion of the intermediate layer 15 which is in contact with the Schottky contact layer 16 is made of GaAs, and a portion in contact with the carrier supply layer 14 is made of $Al_{0.25}Ga_{0.75}As$. Here, since the carrier supply layer 14 is made of $Al_{0.25}Ga_{0.75}As$ as mentioned above, a band discontinuity does not exist at the interface between the intermediate layer 15 and the carrier supply layer 14.

On the other hand, a band discontinuity occurs at the interface between the Schottky contact layer 16 and the intermediate layer 15, because of a difference in composition. However, the amount of this band discontinuity ($\Delta Ec$) is very small as mentioned later.

Figure 2:
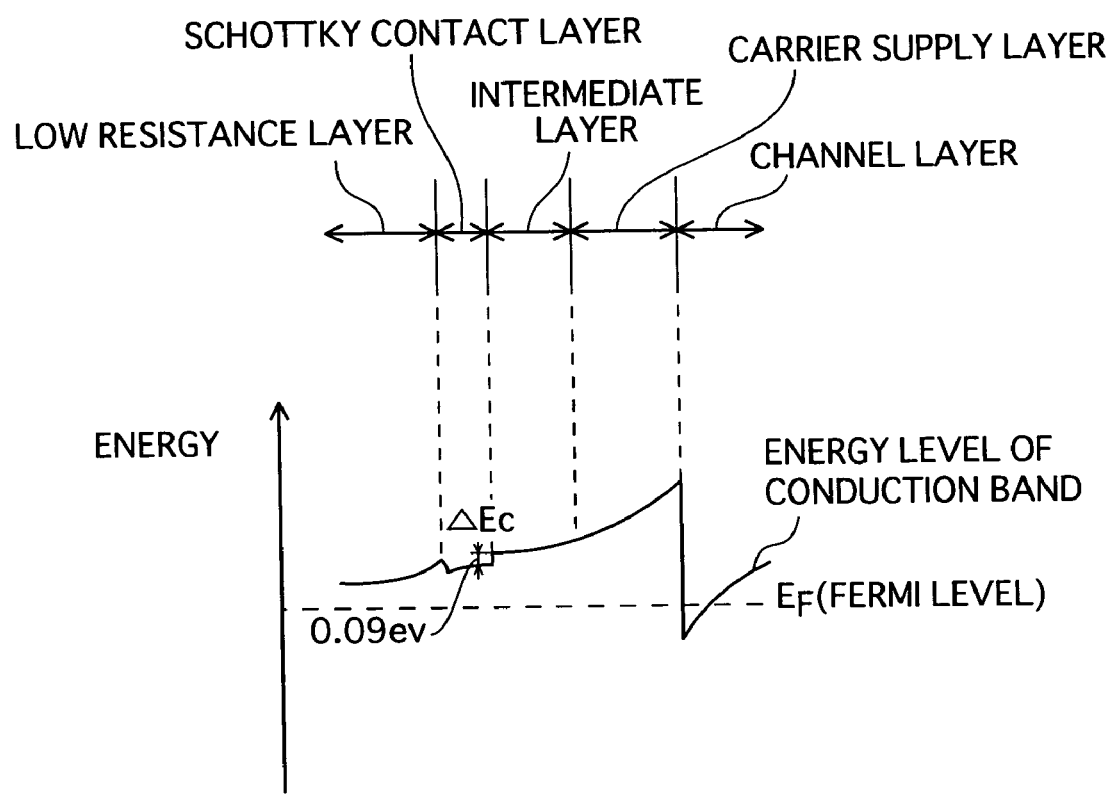
FIG. 2 illustrates an energy change pattern for the FET 1 relating to the first embodiment.

FIG. 2 illustrates an energy change pattern for the FET 1 relating to the first embodiment. In FIG. 2, an energy of a conduction band of each of the layers 13 to 18 shown in FIG. 1 is plotted along the vertical axis, and the layers 18 to 13 are plotted along the horizontal axis in this order.

As mentioned above, when the intermediate layer 15 is made of $Al_xGa_{1-x}As$, the composition ratio x is gradually increased from 0 to 0.25 from the interface between the intermediate layer 15 and the Schottky contact layer 16 to the interface between the intermediate layer 15 and the carrier supply layer 14. Thus, the electron affinity gradually decreases in the intermediate layer 15, thereby increasing the energy of the conduction band continuously and gradually, from the interface between the intermediate layer 15 and the Schottky contact layer 16 to the interface between the intermediate layer 15 and the carrier supply layer 14. As a result, a band discontinuity does not occur at the interface between the intermediate layer 15 and the carrier supply layer 14, and a very small band discontinuity of 0.1 eV or less occurs at the interface between the intermediate layer 15 and the Schottky contact layer 16, as shown in FIG. 2. Therefore, electrons are hardly blocked when going thorough the interface between the Schottky contact layer 16 and the intermediate layer 15. This lowers the source resistance Rs.

Since the ratio of Al is constant at 0.25 in the carrier supply layer 14, a surface charge density of 2DEG accumulated in the channel layer 13 does not decrease despite the gradual change in energy of the conduction band of the intermediate layer 15. Furthermore, since the Schottky contact layer 16 is made of undoped InGaP, which achieves lattice matching with GaAs, the gradual change in energy of the conduction band of the intermediate layer 15 has little impact on the height of the Schottky barrier between the Schottky contact layer 16 and the gate electrode 20.

The first embodiment is especially effective in lowering the source resistance Rs of the FET 1, when a non-alloy ohmic electrode structure is used to form an ohmic contact between the ohmic contact layer 18 and each of the source electrode 21 and the drain electrode 22, in order to solve problems of an alloying process, such as a difficulty in control and a rough metal surface. To be specific, an ohmic contact is formed between the ohmic contact layer 18 and each of the source electrode 21 and the drain electrode 22 without using an alloying process, that is, a thermal treatment.

Manufacturing Method

The following part describes a manufacturing method for the FET 1 relating to the first embodiment.

Figure 3:
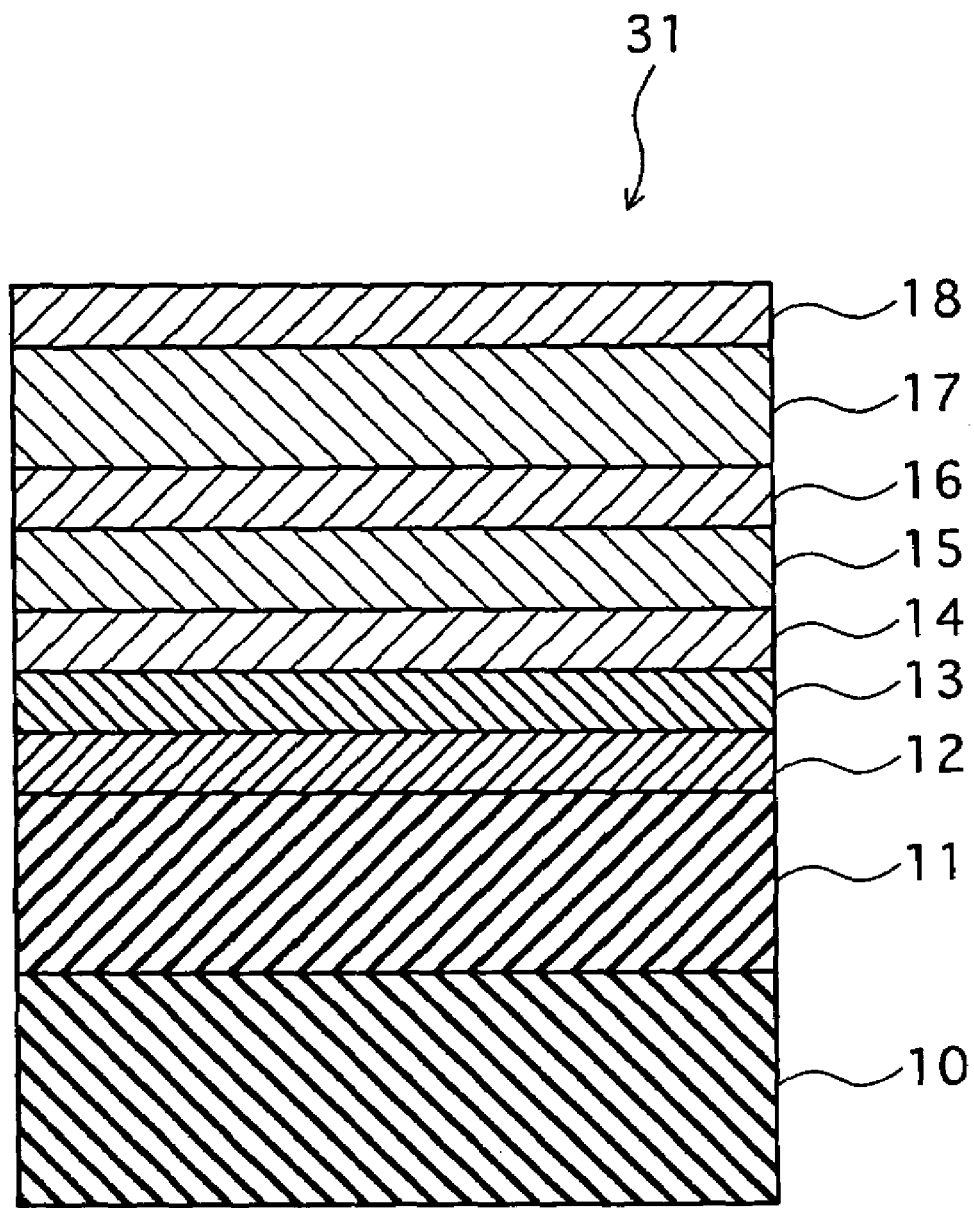
FIG. 3 is a cross-sectional view illustrating a semiconductor lamination 31.

FIG. 3 is a cross-sectional view illustrating a semiconductor lamination 31. As shown in FIG. 3, the semiconductor lamination 31 includes the buffer layer 11, the barrier layer 12, the channel layer 13, the carrier supply layer 14, the intermediate layer 15, the Schottky contact layer 16, the low resistance layer 17 and the ohmic contact layer 18. The layers 11 to 18 are formed by crystal growth in the stated order on the semiconductor substrate 10 to manufacture the FET 1. FIG. 8 shows conditions for the formation of the semiconductor lamination 31 by crystal growth.

FIG. 9 shows conditions for forming each layer by crystal growth. When forming the intermediate layer 15 by crystal epitaxial growth, a gas flow ratio of each of TMGa and TMAl is adjusted so that, when the intermediate layer 15 is made of $Al_xGa_{1-x}As$, the composition ratio x linearly increases from 0 to 0.25, from the interface between the intermediate layer 15 and the Schottky contact layer 16 to the interface between the intermediate layer 15 and the carrier supply layer 14.

After the semiconductor lamination 31 is completed by crystal growth, a resist mask (not shown in FIG. 3) is partially formed on the ohmic contact layer 18. Subsequently, the ohmic contact layer 18 and the low resistance layer 17 are partially etched using a mixture of phosphoric acid and hydrogen peroxide solution. Thus, the opening 30 is formed in the semiconductor lamination 31. Here, the Schottky contact layer 16 plays a role of stopping the etching.

After this, the silicon nitride film 19 is applied using plasma chemical vapor deposition (CVD), on the wall and bottom of the opening 30 and the surface of the ohmic contact layer 18. Subsequently, areas of the silicon nitride film 19 in which the gate electrode 20, the source electrode 21, and the drain electrode 22 are to be formed are removed by dry etching.

After this, WSi, Ti, Pt and Au are applied on the resulting surface in the stated order by sputtering, to form a lamination film (not shown in FIG. 3).

After this, the lamination film is partially removed by dry etching except for areas in which the gate electrode 20, the source electrode 21 and the drain electrode 22 are to be formed. In this way, the FET 1 shown in FIG. 1 is completed.

(Second Embodiment)

Construction

An FET relating to a second embodiment is different from the FET 1 relating to the first embodiment in that the composition ratio x is constant at 0.15 in the entire intermediate layer 15. Except for this, the FET relating to the second embodiment is the same as the FET 1. Therefore, an explanation of a construction of the FET relating to the second embodiment is omitted.

As described above, the composition ratio x is constant in the entire intermediate layer 15 in the second embodiment. Therefore, a manufacturing method for the FET relating to the second embodiment can be simplified when compared with that for the FET 1.

Figure 4:
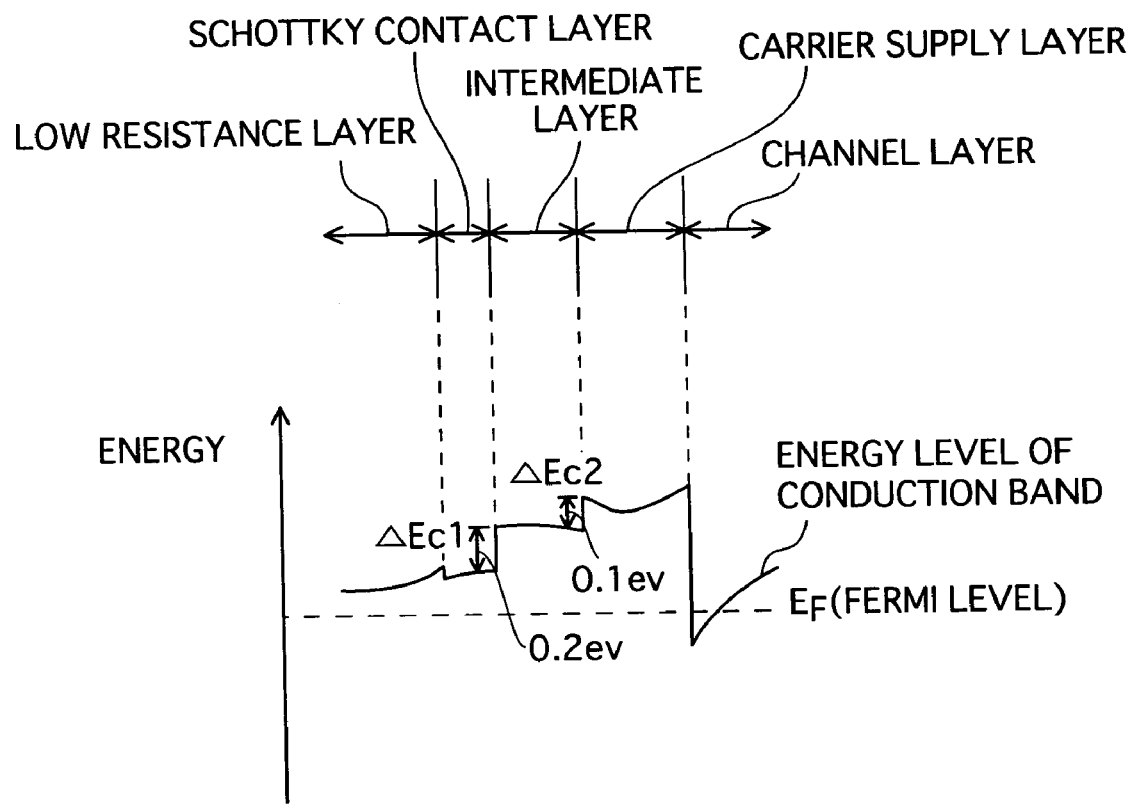
FIG. 4 illustrates an energy change pattern for an FET relating to a second embodiment.
Figure 5:
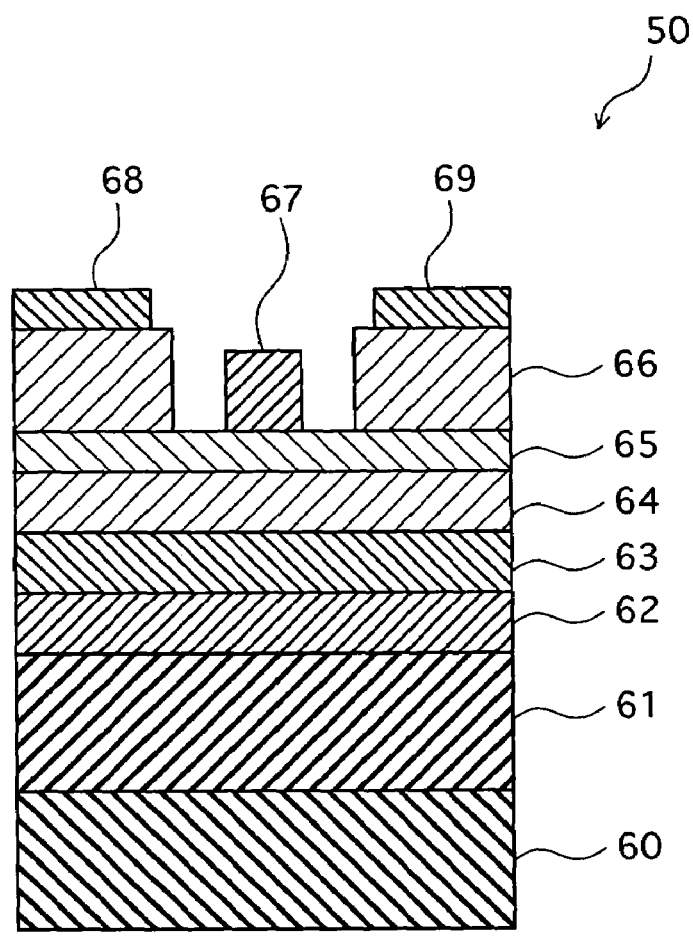
FIG. 5 is a cross-sectional view illustrating a conventional FET 50.

FIG. 4 shows an energy change pattern for the FET relating to the second embodiment. As seen from FIG. 4, a band discontinuity ($\Delta Ec1$) of approximately 0.2 eV exists at the interface between the intermediate layer 15 and the Schottky contact layer 16, and a band discontinuity ($\Delta Ec2$) of approximately 0.1 eV exists at the interface between the intermediate layer 15 and the carrier supply layer 14. This is because the composition ratio x is discontinuous over the interface between the intermediate layer 15 and the Schottky contact layer 16, and over the interface between the intermediate layer 15 and the carrier supply layer 14.

Figure 6:
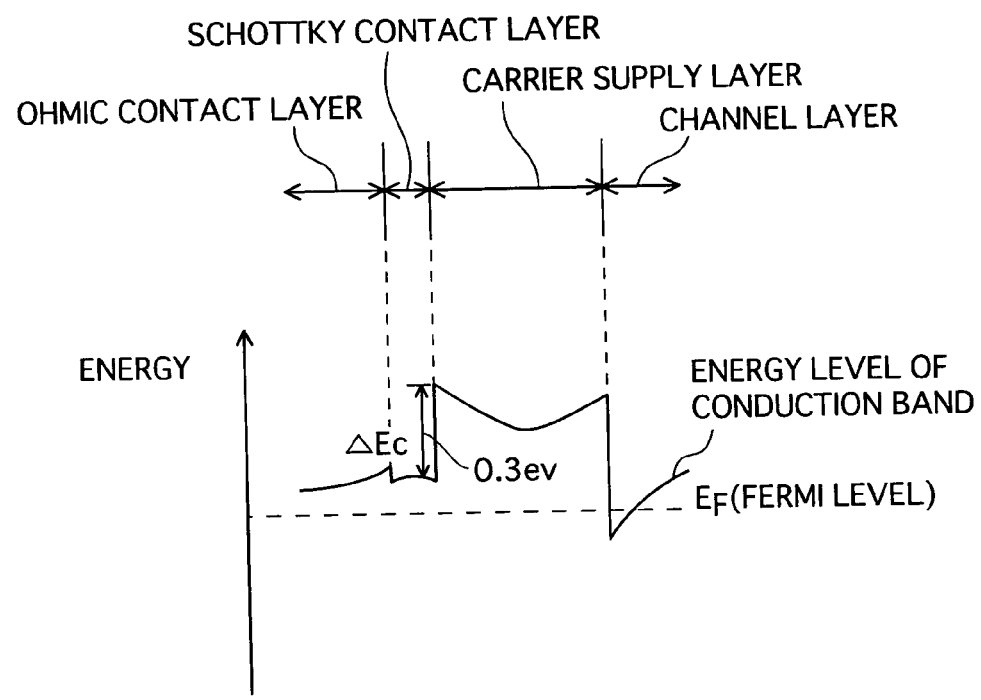
FIG. 6 illustrates an energy change pattern for the conventional FET 50.

The following formula (4) indicates a relation between $\Delta Ec1$, $\Delta Ec2$, and $\Delta Ec$ that is the amount of the band discontinuity at the interface between the Schottky contact layer 65 and the carrier supply layer 64 of the conventional FET 50 (shown in FIG. 6 illustrating an energy change pattern for the conventional FET 50). It should be noted that the formula (4) is not true when the electron affinity $\chi$ is changed continuously in the intermediate layer 15 as in the first embodiment.

$$\Delta Ec1 + \Delta Ec2 = \Delta Ec \quad (4)$$

According to the second embodiment, the composition ratio x is constant in the entire intermediate layer 15 between the carrier supply layer 14 and the Schottky contact layer 16. In this case, the sum of the amounts of the band discontinuities at the interface between the intermediate layer 15 and the Schottky contact layer 16, and at the interface between the intermediate layer 15 and the carrier supply layer 14 is equal to the amount ($\Delta Ec$) of the band discontinuity which is observed at the interface between the Schottky contact layer 65 and the carrier supply layer 64, without an intermediate layer therebetween.

In other words, the single band discontinuity ($\Delta Ec$) is divided into two smaller band discontinuities ($\Delta Ec1$ and $\Delta Ec2$) by the intermediate layer 15 according to the second embodiment. The band discontinuities ($\Delta Ec1$ and $\Delta Ec2$) are each less likely to block movement of electrons.

It should be noted that the FET relating to the second embodiment has a larger source resistance Rs than the FET 1 relating to the first embodiment. However, each of the band discontinuities ($\Delta Ec1$ and $\Delta Ec2$) is smaller ($\Delta Ec1$=approximately 0.2 eV, and $\Delta Ec2$=approximately 0.1 eV) than the band discontinuity at the interface between the Schottky contact layer 65 and the carrier supply layer 64 ($\Delta Ec$=approximately 0.3 eV as shown in FIG. 6). Accordingly, the FET relating to the second embodiment has a lower source resistance Rs than the conventional FET 50.

According to the second embodiment, the composition ratio x is constant (at 0.15 in the second embodiment) in the intermediate layer 15 between the Schottky contact layer 16 and the carrier supply layer 14, so that the electron affinity of the intermediate layer 15 is smaller than that of the Schottky contact layer 16, but larger than that of the carrier supply layer 14. As a result, the FET relating to the second embodiment has a lower source resistance Rs than a FET which does not include an intermediate layer.

MODIFICATION EXAMPLES (1) According to the first and second embodiments, the substrate 10 is made of GaAs, the carrier supply layer 14 and the intermediate layer 15 are made of AlGaAs, and the Schottky contact layer 16 is made of InGaP. However, the present invention is not limited to such.

FIG. 10 shows alternative compound semiconductor materials for the substrate 10, the carrier supply layer 14, the intermediate layer 15, and the Schottky contact layer 16. The examples 1 and 2 shown in FIG. 10 enable the energy change pattern shown in one of FIGS. 2 and 4 to be achieved, and therefore can lower the source resistance Rs.

(2) According to the first embodiment, the composition ratio x in the $Al_xGa_{1-x}As$ intermediate layer 15 is changed linearly from the interface between the intermediate layer 15 and the Schottky contact layer 16 to the interface between the intermediate layer 15 and the carrier supply layer 14. However, the present invention is not limited to such.

The composition ratio x can be changed in any manner in the intermediate layer 15, as long as the composition ratio x continuously (gradually) increases from 0 to 0.25, from the interface between the intermediate layer 15 and the Schottky contact layer 16 to the interface between the intermediate layer 15 and the carrier supply layer 14.

(3) According to the second embodiment, the composition ratio x is set to 0.15 in the intermediate layer 15, but not limited to such.

The composition ratio x in the intermediate layer 15 can be set to any value in a range from no less than 0 to less than 0.25. In other words, the composition ratio x in the intermediate layer 15 is set, so that the energy of the conduction band of the intermediate layer 15, which is determined in accordance with the composition ratio x, is larger than an energy of a conduction band of the Schottky contact layer 16 at the interface between the intermediate layer 15 and the Schottky contact layer 16, and smaller than an energy of a conduction band of the carrier supply layer 14 at the interface between the intermediate layer 15 and the carrier supply layer 14.

(4) According to the first embodiment, a portion of the intermediate layer 15 in the vicinity of the carrier supply layer 14 has the same composition as the carrier supply layer 14, and can generate carriers. Therefore, it can be said that part of the intermediate layer 15 is virtually an extended part of the carrier supply layer 14. Considering this, the first and second embodiments may be modified in the following manner. To start with, the intermediate layer 15 is not provided between the Schottky contact layer 16 and the carrier supply layer 14. Furthermore, the ratio of Al in a portion of the carrier supply layer 14 which is contiguous to the Schottky contact layer 16 is made different from the ratio of Al in the remaining portion of the carrier supply layer 14. This can achieve a smaller band discontinuity at an interface between the carrier supply layer 14 and the Schottky contact layer 16 than in the related art.

For example, an upper half of the carrier supply layer 14, which is closer to the Schottky contact layer 16, may be constituted as the contiguous portion. Here, the upper half is made of $Al_xGa_{1-x}As$, where the composition ratio x gradually increases from 0 to 0.25, from the interface between the carrier supply layer 14 and the Schottky contact layer 16 to the boundary between the upper and lower halves in the carrier supply layer 14. Here, the lower half of the carrier supply layer 14 may be made of $Al_{0.25}Ga_{0.75}As$.

In this way, a difference in electron affinity is smaller between the upper half and the Schottky contact layer 16 than between the lower half and the Schottky contact layer 16. Furthermore, the electron affinity gradually increases in the upper half towards the interface between the carrier supply layer 14 and the Schottky contact layer 16. Accordingly, the energy of the conduction band gradually decreases in the upper half towards the interface between the carrier supply layer 14 and the Schottky contact layer 16. As a result, a band discontinuity at the interface between the carrier supply layer 14 and the Schottky contact layer 16 can be effectively reduced. This results in a significant decrease in source resistance Rs.

Note that the contiguous portion can be any part of the carrier supply layer 14, and not limited to the upper half.

The composition ratio x may not be changed in the contiguous portion, but fixed to any value between 0 and 0.25.

(5) The present invention includes any combination of the first and second embodiments and the above-described modification examples.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A field-effect transistor comprising:
   a carrier supply layer supplying carriers;
   a Schottky contact layer forming a Schottky barrier; and
   an intermediate layer formed between the carrier supply layer and the Schottky contact layer, the intermediate layer having an electron affinity which is higher than an electron affinity of the carrier supply layer but lower than an electron affinity of the Schottky contact layer, wherein
   the Schottky contact layer is made of InGaP, the carrier supply layer is made of $Al_{0.25}Ga_{0.75}As$,
   the intermediate layer is made of $Al_xGa_{1-x}As$, where $0 \leq x \leq 0.25$, x denoting a composition ratio, and
   the composition ratio x gradually increases from the interface between the intermediate layer and the Schottky contact layer to the interface between the intermediate layer and the carrier supply layer.

2. The field-effect transistor of claim 1, wherein the composition ratio x gradually increases from 0 at the interface between the intermediate layer and the Schottky contact layer, to 0.25 at the interface between the intermediate layer and the carrier supply layer.

3. A field-effect transistor comprising:
   a carrier supply layer supplying carriers;
   a Schottky contact layer forming a Schottky barrier; and
   an intermediate layer formed between the carrier supply layer and the Schottky contact layer, the intermediate layer having an electron affinity which is higher than an electron affinity of the carrier supply layer but lower than an electron affinity of the Schottky contact layer, wherein
   the Schottky contact layer is made of InGaP,
   the carrier supply layer is made of $Al_{0.25}Ga_{0.75}As$, and
   the intermediate layer is made of $Al_xGa_{1-x}As$, where x is a composition ratio and takes any value in a range no less than 0 but less than 0.25.

4. A field-effect transistor comprising:
   a carrier supply layer supplying carriers; and
   a Schottky contact layer provided on the carrier supply layer, the Schottky contact layer forming a Schottky barrier, wherein
   the carrier supply layer is divided into a first portion and a second portion, where the first portion is closer to the Schottky contact layer than the second portion is,
   a composition of a compound semiconductor is different between the first portion and the second portion, so that a difference in electron affinity is smaller between the first portion and the Schottky contact layer, than between the second portion and the Schottky contact layer,
   the second portion is made of $Al_{0.25}Ga_{0.75}As$,
   the first portion is made of $Al_xGa_{1-x}As$, where x denotes a composition ratio, and
   the composition ratio x gradually increases from 0 at an interface between the first portion and the Schottky contact layer, to 0.25 at an interface between the first portion and the second portion.

5. A field-effect transistor comprising:
a carrier supply layer supplying carriers;
a Schottky contact layer forming a Schottky barrier; and
an intermediate layer formed between the carrier supply layer and the Schottky contact layer, the intermediate layer having an electron affinity which is higher than an electron affinity of the carrier supply layer but lower than an electron affinity of the Schottky contact layer, wherein the electron affinity of the intermediate layer gradually increases from an interface between the intermediate layer and the carrier supply layer to an interface between the intermediate layer and the Schottky contact layer, the Schottky contact layer is made of InGaP, the carrier supply layer is made of $Al_{0.25}Ga_{0.75}As$, and the intermediate layer is made of $Al_xGa_{1-x}As$, where $0 \leq x \leq 0.25$, x denoting a composition ratio, and the composition ratio x gradually increases from the interface between the intermediate layer and the Schottky contact layer to the interface between the intermediate layer and the carrier supply layer.

\* \* \* \* \*